United States Patent
Kim et al.

(12)

(10) Patent No.: US 6,613,487 B1
(45) Date of Patent: Sep. 2, 2003

(54) PRE-ALIGNMENT SYSTEM OF EXPOSURE APPARATUS HAVING WAFER COOLING MEANS AND EXPOSURE METHOD USING THE SAME

(75) Inventors: Sang-kap Kim, Suwon (KR); Yo-han Ahn, Seongnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 246 days.

(21) Appl. No.: 09/655,449

(22) Filed: Sep. 5, 2000

(30) Foreign Application Priority Data

Sep. 6, 1999 (KR) .......................................... 1999-37661

(51) Int. Cl.⁷ .............................. G03F 9/00; G03B 27/00
(52) U.S. Cl. .............................. 430/22; 430/30; 355/18
(58) Field of Search .............................. 355/18; 430/22, 430/30

(56) References Cited

FOREIGN PATENT DOCUMENTS

| KR | P1998-033219 | 7/1998 |
|---|---|---|
| KR | P1999-020125 | 3/1999 |
| KR | P1999-0057701 | 7/1999 |

*Primary Examiner*—Christopher G. Young
(74) *Attorney, Agent, or Firm*—Volentine Francos, PLLC

(57) ABSTRACT

A wafer exposure apparatus includes a special wafer cooling unit, namely, an air showerhead, for controlling the temperature of a wafer which is to be transferred from a wafer pre-alignment system to a wafer stage of photolithography exposure equipment. The wafer which has been heated in the course of being transferred from a spin coater to the wafer pre-alignment system, and may be further heated by sensors of the wafer pre-alignment system, is cooled to the same temperature as that of a wafer stage. Accordingly, a thermal equilibrium may be rapidly established between the wafer and the wafer stage when the wafer is transferred to the wafer stage. Accordingly, excessive thermal expansion of the wafer caused by a difference in temperature between the wafer and the wafer stage is prevented. Therefore, an excessive error in aligning the wafer with the optics of the photolithography exposure equipment can be prevented.

9 Claims, 4 Drawing Sheets

PRE-ALIGNMENT SYSTEM OF EXPOSURE APPARATUS HAVING WAFER COOLING MEANS AND EXPOSURE METHOD USING THE SAME

BACKGROUND OF THE INVENTION

1. Field of the Invention

The present invention relates to a semiconductor wafer exposure apparatus and to a method of using the same to expose a photosensitive film formed on the wafer.

2. Description of the Related Art

During the fabricating of semiconductor devices, wafers are subjected to a sequence of different manufacturing processes. In the course of such a sequence, the wafers go through changes in temperature from room temperature to a temperature of more than several hundred degrees centigrade. Accordingly, the wafers experience thermal expansion and contraction during the processes.

Ideally, the physical characteristics of wafers should be maintained throughout the sequence of manufacturing processes. However, the physical characteristics of wafers change due to thermal expansion and contraction thereof during the different manufacturing processes. This causes an error in aligning the wafers with optical equipment during photolithography. Such an alignment error, if in excess of a predetermined limit, results in a defective final product.

More specifically, in the fabricating of semiconductor devices, a photolithographic process includes coating a wafer with photoresist, and aligning, illuminating and developing the wafer. FIG. 1 shows a conventional aligning exposure apparatus Referring to FIG. 1, reference numeral 10 designates a spin coater for coating a wafer with a photoresist. The wafer coated with the photoresist by the spin coater 10 is transferred to an exposure apparatus 12. The exposure apparatus 12 comprises a wafer transfer system 14, a wafer pre-alignment system 16, a wafer stage 18 and a D-chuck 20. The wafer coated with the photoresist film by the spinner 10 is transferred via the wafer transfer system 14 to the wafer pre-alignment system 16. The wafer is pre-aligned by the wafer pre-alignment system 16 before being transferred to the wafer stage 18. Specifically, a flat zone of the wafer is oriented in a predetermined direction. The pre-aligned wafer is transferred to the wafer stage 18 and is then accurately aligned with optics of the photolithography exposure equipment. Thereafter, an exposure process is executed. In the exposure process, the same pattern as that carved in a reticle is transferred to the film of photoresist on the wafer. Then the wafer is transferred via the D-chuck 20 and the wafer transfer system 14 to the spin coater.

FIG. 2 is a sectional view of part of the wafer pre-alignment system 16 of the conventional wafer aligning exposure apparatus 12. Referring to FIG. 2, the wafer pre-alignment system 16 comprises a P-chuck 22 on which a wafer is loaded, and mark and edge sensors 23 and 24 disposed around the P-chuck 22. The edge sensor 24 senses is a flat zone of the wafer W loaded on the P-chuck 22. The mark sensor 23 is used to orient the sensed flat zone in the predetermined direction. The edge sensor 24 generates heat while sensing the flat zone of the wafer W, and therefore, the temperature of a portion of the wafer W exposed to the edge sensor 24 increases.

As described above, elements of the conventional aligning exposure apparatus have heat generation elements which increase the temperature of a wafer. In the wafer aligning exposure apparatus 12, the wafer transfer system 14, the wafer pre-alignment system 16 and the wafer stage 18 have different temperature environments. For example, the wafer stage 18 consistently maintains its temperature using a special temperature control device. On the other hand, the wafer transfer system 14 and the wafer pre-alignment system 16 use the air supplied from a cleanroom to control their temperatures. Not only does air heated by various heat generation sources in the cleanroom flow into the systems, but also each system itself of the wafer aligning exposure apparatus 12 has a heat generation element such as the edge sensor 24. Thus, the inside of each system of the aligning exposure apparatus is heated. Furthermore, since different aligning exposure apparatuses are used for different processes during the fabrication of semiconductor devices, different wafer transfer systems and different wafer pre-alignment systems are used.

For these reasons, the wafer which passes through the wafer transfer system 14 or the wafer pre-alignment system 16 in the exposure apparatus 12 is heated, and therefore, the temperature of the wafer is higher than a temperature maintained at the wafer stage 18 when the wafer arrives at the wafer stage 18. This means that the wafer has thermally expanded to a much greater extent than it would have thermally expanded at the wafer stage 18. Accordingly, the alignment error of the wafer becomes so great that the pattern of the reticle cannot be accurately transferred to the wafer. To prevent this problem, before the alignment and exposure processes are carried out, the wafer is caused to remain at the wafer stage 18 for a long time sufficient for the wafer and the wafer stage 18 to attain a state of thermal equilibrium. However, requiring the wafer to remain idle for a long period of time compromises the productivity of the semiconductor fabricating process.

SUMMARY OF THE INVENTION

It is therefore an object of the present invention to prevent excessive thermal expansion of a wafer caused by a difference in temperature between a wafer stage and the wafer, without requiring the wafer to remain idle at the wafer stage for a prolonged period of time, thereby reducing the possibility of an alignment error without compromising the productivity of the manufacturing process.

To achieve this object, the present invention forcibly cools the wafer before it is transferred to the wafer stage.

To this end, the exposure apparatus of the present invention includes a wafer transfer system, a wafer pre-alignment system comprising a P-chuck, mark and edge sensors disposed around the P-chuck, and a wafer cooling unit for cooling a wafer while it is being pre-aligned, a wafer alignment system including a wafer stage, and a D-chuck.

The wafer cooling unit is installed over the P-chuck between the mark sensor and the edge sensor.

The wafer cooling unit is in the form of an air showerhead which sprays a cooling gas onto the entire surface of a wafer loaded on the P-chuck.

In a method of the present invention, a wafer is transferred from a spin coater to a wafer transfer system and from there to the wafer pre-alignment system.

The cooling of the wafer is preferably performed at the pre-alignment system while the wafer is being pre-aligned and until the temperature of the wafer becomes equal to a predetermined temperature prevailing inside the wafer alignment system.

The wafer is then transferred to the wafer stage of the alignement system where it is aligned with the optics of the photolithography exposure equipment and is then irradiated with light produced by a light source of the exposure equipment, whereby a photosensitive film formed on the wafer in the spin-coater is exposed.

As described above, the present invention forcibly cools the wafer in the wafer pre-alignment system to make the temperature of the wafer equal to that of the wafer stage just before it is transferred to the wafer stage. Consequently, the thermal expansion of the wafer coincides with that which would occur at the wafer stage, thereby preventing wafer alignment errors from occurring.

BRIEF DESCRIPTION OF THE DRAWINGS

The above and other objects, features and advantages of the present invention will become more apparent by referring to the following detailed description of the preferred embodiment thereof made with reference to the attached drawings, of which.

DETAILED DESCRIPTION OF THE PREFERRED EMBODIMENT

Figure 1:
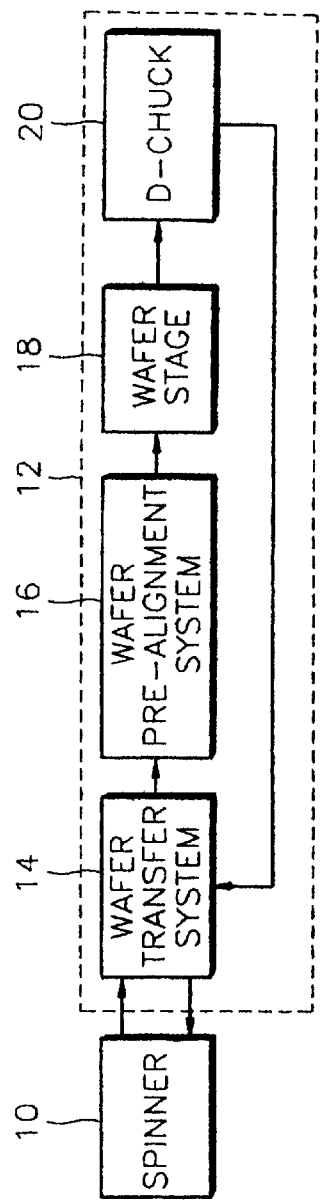
FIG. 1 is a block diagram of a conventional wafer aligning exposure apparatus.
Figure 2:
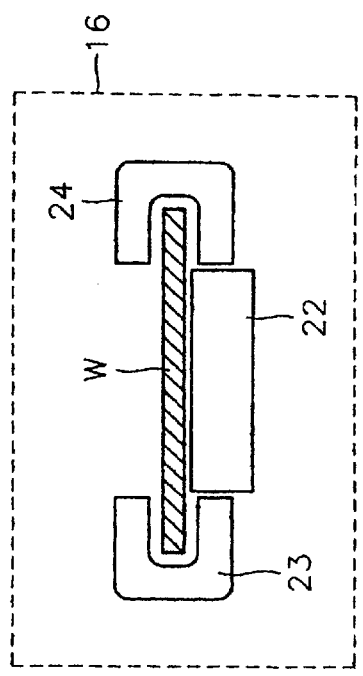
FIG. 2 is a sectional view of part of a wafer pre-alignment system of the conventional wafer aligning exposure apparatus.

The present invention will now be described more fully with reference to the accompanying drawings. The same reference numerals designate like elements throughout the drawings. Furthermore, the present invention is applicable to any basic photolithographic process used for fabricating semiconductor devices. As a matter of convenience and again, for the sake of clarity, the present invention will be described with reference to a stepper-type of exposure apparatus.

Figure 3:
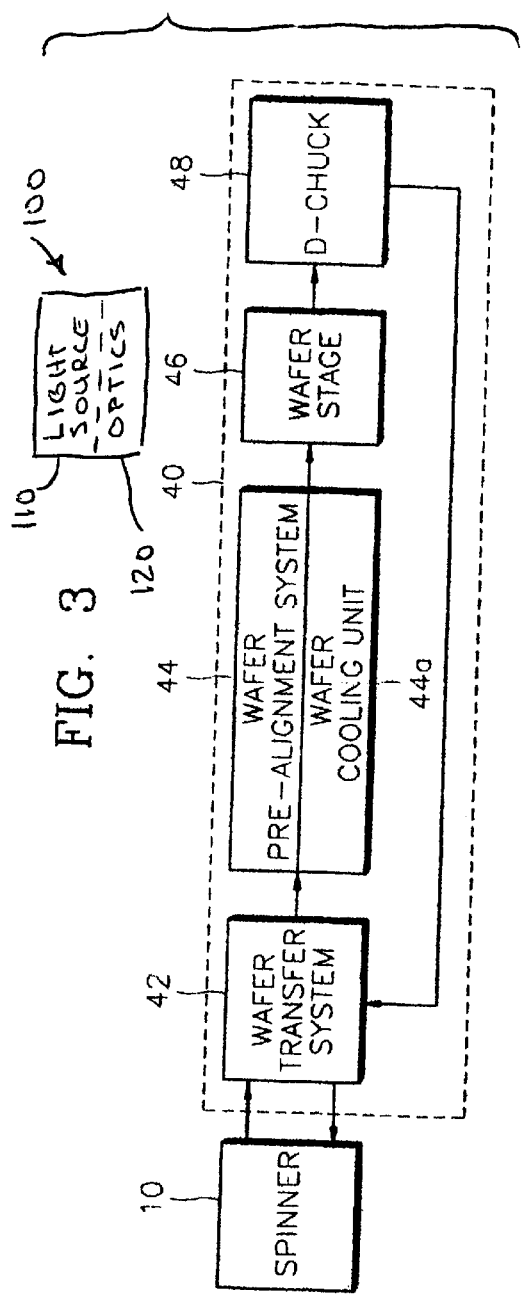
FIG. 3 is a block diagram of an embodiment of a wafer aligning exposure apparatus according to the present invention.

Referring now to FIG. 3, an exposure apparatus 40 of the present invention includes a wafer transfer system 42, a wafer pre-alignment system 44, a wafer stage 46 and a D-chuck 48. The wafer pre-alignment system 44 includes a wafer cooling unit 44a.

As a wafer from the spin coater 10 passes through the wafer transfer system 42 and the wafer pre-alignment system 44 before arriving at the wafer stage 46, part of the wafer is heated by an edge sensor of the wafer pre-alignment system 44. The wafer cooling unit 44a serves to cool the wafer before the wafer is transferred to the wafer stage 46. In other words, the wafer cooling unit 44a cools the wafer, which is being heated until it arrives at the wafer pre-alignment system 44, to a predetermined temperature, preferably, to the temperature of the wafer stage 46. To this end, the wafer cooling unit 44a comprises an air showerhead.

Figure 4:
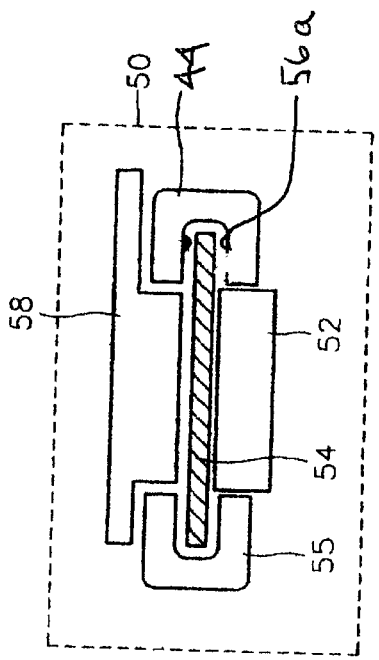
FIG. 4 is a sectional view of part of a wafer pre-alignment system of the wafer aligning exposure apparatus according to the present invention.

Referring to FIG. 4, the wafer pre-alignment system 44 includes a P-chuck 52, onto which a wafer 54 is loaded, disposed at a lower portion thereof. A mark sensor 55 extends around part of the P-chuck 52, and an edge sensor 56 is disposed opposite the mark sensor 55. Once the wafer 54 is loaded on the P-chuck 52, the edge sensor 56 senses a particular portion thereof, namely, a flat zone of the wafer 54. The mark sensor 55 is then used to orient the flat zone of the wafer 54 so as to face in a predetermined direction.

As shown in FIG. 4, the wafer 54 is loaded on the P-chuck 52 such that parts of the peripheral edge of the wafer 54 are surrounded by the mark sensor 55 and the edge sensor 56. In other words, the mark sensor 55 and the edge sensor 56 both have areas facing the top and bottom surfaces near the periphery of the loaded wafer 54. A wafer cooling unit for cooling the wafer 54 is provided over the P-chuck 52 such that the wafer 54 is interposed between the wafer cooling unit and the P-chuck 52. As mentioned above, the wafer cooling unit 58 is an air showerhead 58. A cooling gas, for example, air, is ejected towards the surface of the wafer 54 by the wafer cooling unit.

Figure 5:
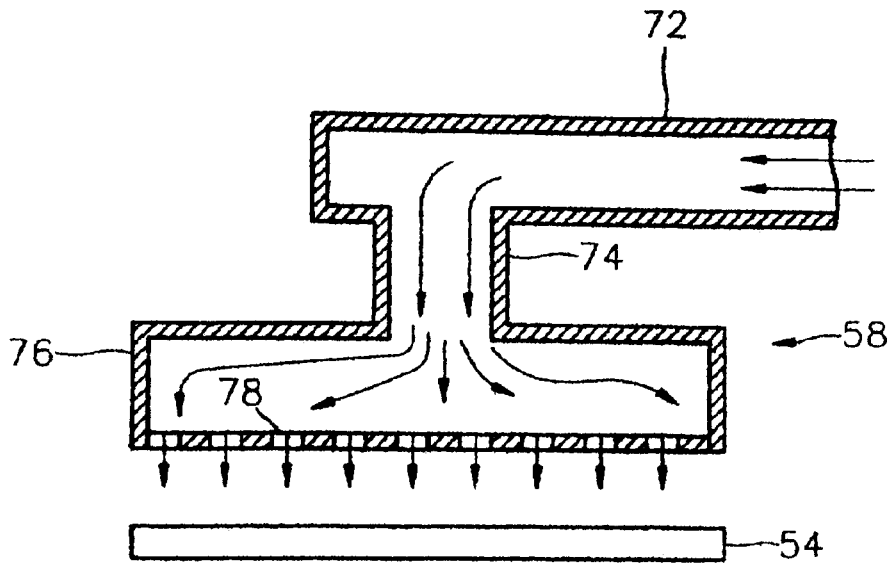
FIG. 5 is a sectional view of a wafer cooling unit of the wafer pre-alignment system according to the present invention.

Referring now to FIG. 5, the air showerhead 58 includes an air duct 72, namely, a cooling gas inlet pipe through which cooling gas flows, a gas ejection portion 76 from which the cooling gas is sprayed over the entire surface of the underlying wafer 54, and a necked portion 74 (hereinafter "neck") extending between the air duct 72 and the gas ejection portion 76. The neck 74 of the air showerhead 58 has a reduced cross-sectional area which causes the cooling gas flowing into the gas ejection portion 76 from the air duct 72 to rapidly flow over the entire surface of the wafer 54. A plurality of holes 78 are formed in a bottom plate of the gas ejection portion 76 which faces the wafer 54. The holes 78 usually have the same diameter, but the diameters of the holes may vary as circumstances dictate.

Figure 6:
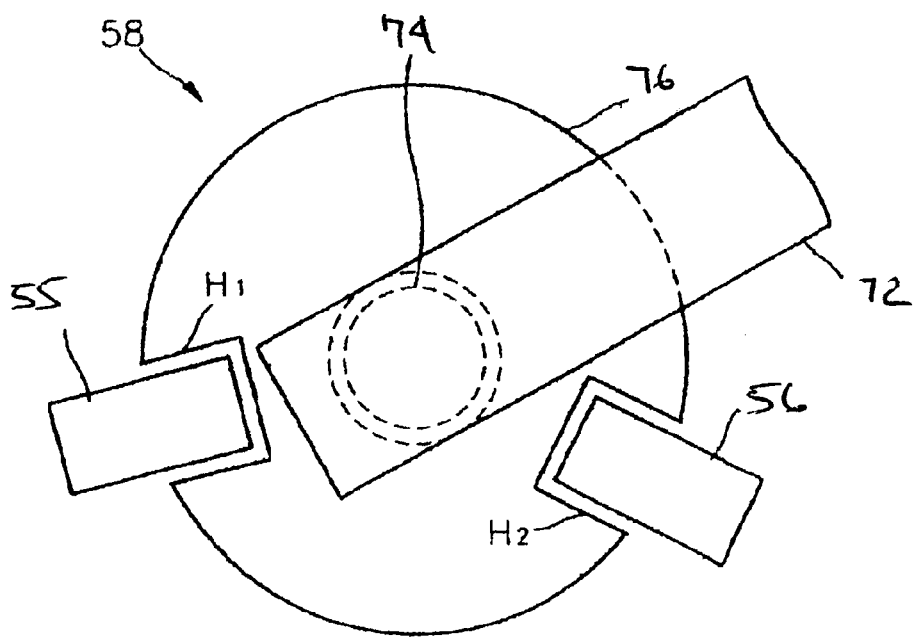
FIGS. 6 and 7 are a plan view and a bottom view of the wafer cooling unit.
Figure 7:
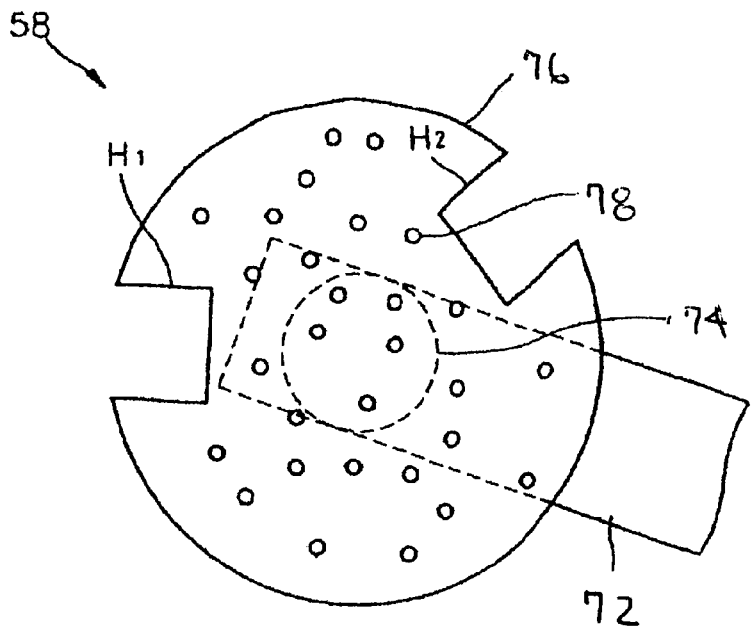

Referring to FIG. 6, the shape of the gas ejection portion 76 of the wafer cooling unit when viewed from the top is circular, with the exception of first and second recesses H1 and H2 defined at the outer periphery of the wafer cooling unit. The first and second recesses H1 and H2 respectively accommodate the mark sensor 55 and the edge sensor 56. As a result, the wafer cooling unit faces the entire surface of the wafer 54 except at the areas covered by the sensors 55 and 56. As shown in FIG. 7, the holes 78 are arrayed uniformly over the entire surface of the bottom plate of the gas ejection portion 76 of the wafer cooling unit which faces the wafer.

Figure 8:
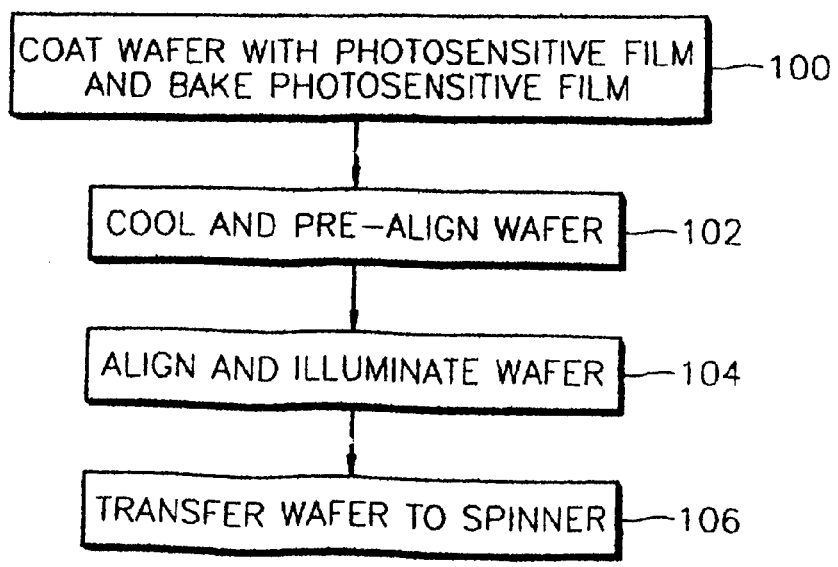
FIG. 8 is a flowchart of an embodiment of an exposure method according to the present invention, using the exposure apparatus of FIG. 3.

Next, a method of exposing a semiconductor wafer using the exposure apparatus of the present invention will be described with reference to FIG. 8. In a first step, Step 100, a wafer is coated in the spin coater 10 with a photosensitive material, for example, a photoresist, to form a photosensitive film thereon, and then the photosensitive film is baked at a predetermined temperature until the photosensitive film is in a state suitable for light exposure.

After the photosensitive film coating and baking step is completed in the spinner 10, the wafer is transferred to the wafer pre-alignment system 44 by the wafer transfer system 42. There (refer back to FIG. 4) the edge sensor 56 senses a flat zone of the wafer 54. The mark sensor 55 is then used to orient the flat zone of the wafer 54 so as to face in a predetermined direction.

More specifically, the edge sensor 56 comprises optical sensor elements 56a facing both sides of the wafer 54. The optical sensor elements 56a shine light toward the bottom of the wafer, at the periphery thereof, in the process of sensing for the flat zone of the wafer 54. During this process, a portion of the wafer 54 passing through the edge sensor 56 is exposed to the light, whereby that portion of the wafer 54 attains a higher temperature than other portions of the wafer 54.

Next, the wafer 54 is cooled using the wafer cooling unit 44a, namely, the air showerhead 58 provided over the P-chuck 52 of the wafer pre-alignment equipment 50 comprising alignment systems 44 and cooling unit 44a. At this time, the wafer is preferably cooled to a temperature of the wafer stage 46 disposed downstream of the wafer pre-alignment equipment 50. (Step 102).

If the wafer were not cooled before being transferred to the wafer stage 46, the wafer would have to remain idle at the wafer stage or the possibility of an alignment error occurring would increase.

The third step, Step 104, is a wafer aligning and illuminating step. More specifically, the wafer which has been pre-aligned and cooled by the wafer pre-alignment equipment 50 is transferred to the wafer stage 46 where it is aligned with the optics 120 of photolithography exposure equipment 100 and exposed to light focused thereon by the optics 120. In this respect, the mechanism of the alignment system for aligning the wafer on the wafer stage with the optics 120 of the photolithography equipment is well-known per se and as such, will not be described here in any detail. Now, a thermal equilibrium exists between the wafer 54 and the wafer stage 46 because the wafer has already been cooled to the temperature of the wafer stage 46 by the wafer pre-alignment equipment 50. Therefore, the wafer aligning and illuminating step may be carried out rapidly. Moreover, an excessive alignment error caused by a difference in temperature between the wafer 54 and the wafer stage 46 is prevented.

The fourth step, Step 106, comprises transferring the wafer 54, which has been completely exposed, to a spinner via the wafer transfer system 42. Specifically, the irradiated wafer is transferred to the D-chuck 48. Thereafter, the wafer 54 is transferred from the D-chuck 48 to the spin coater 10 via the wafer transfer system 42.

Although the present invention has been described with reference to the preferred embodiment thereof, various changes thereto and modifications thereof will be apparent to those skilled in the art. For example, the bottom plate of the gas ejection portion 76 having the holes 78 formed therein may be replaced by a permeable membrane which allows the cooling gas to pass therethrough. Therefore, the true spirit and scope of the present invention encompasses all such changes and modifications as defined by the appended claims.

What is claimed is:

1. A wafer exposure apparatus comprising:

wafer pre-alignment equipment including a P-chuck, at least one wafer sensor disposed beside said P-chuck at a location which will face a surface of a wafer supported on the P-chuck, and wafer cooling means for cooling a wafer supported on the P-chuck and heated by heat generated by said at least one sensor;

a wafer stage disposed downstream of said wafer pre-alignment system in the apparatus; and photolithography exposure equipment for exposing a wafer supported on said wafer stage to light.

2. The apparatus of claim 1, wherein said at least one wafer sensor comprises a wafer edge sensor for sensing for the presence of a peripheral edge of the wafer, and a wafer mark sensor, and said wafer cooling means is disposed over said P-chuck between the mark sensor and the edge sensor in the wafer pre-alignment equipment.

3. The appartus of claim 1, and further comprising a wafer transfer system operative to transfer a wafer from said P-chuck of the wafer pre-alignment equipment to said wafer stage.

4. A wafer exposure apparatus comprising:

wafer pre-alignment equipment including a P-chuck, at least one wafer sensor disposed beside said P-chuck at a location which will face a surface of a wafer supported on the P-chuck, and a showerhead which sprays a cooling gas over the entire surface of a wafer supported on the P-chuck and heated by heat generated by said at least one sensor;

a wafer stage disposed downstream of said wafer pre-alignment system in the apparatus; and photolithography exposure equipment for exposing a wafer supported on said wafer stage to light.

5. The apparatus of claim 4, wherein the showerhead comprises an air duct, a gas ejection portion through which the cooling gas exits the showerhead, and a necked portion extending between the air duct and the gases ejection portion, said necked portion having a horizontal cross-sectional which is less than that of said gas ejection portion.

6. The apparatus of claim 5, wherein said gas ejection portion has a bottom plate facing said P-chuck, said bottom plate having a plurality of holes therethrough.

7. The apparatus of claim 6, wherein the plurality of holes are arrayed uniformly.

8. The apparatus of claim 7, wherein all of the holes in said bottom plate have the same diameter.

9. The apparatus of claim 4, and further comprising a wafer transfer system operative to transfer a wafer from said P-chuck of the wafer pre-alignment equipment to said wafer stage.

* * * * *